United States Patent [19]

Elsaesser

[11] 3,766,410

[45] Oct. 16, 1973

[54] STABILIZING CIRCUIT FOR STANDING CURRENTS

[75] Inventor: Dieter Elsaesser, Katzwang, Germany

[73] Assignee: EMV Elektro-Mechanische Versuchsanstalt Max Grundig, Furth/Bay, Germany

[22] Filed: Aug. 16, 1971

[21] Appl. No.: 172,079

[30] Foreign Application Priority Data

Aug. 20, 1970 Germany .................. P 20 41 345.0

[52] U.S. Cl. .................... 307/255, 307/297, 330/15

[51] Int. Cl. .......................................... H03k 17/00

[58] Field of Search .................... 307/310, 297, 255, 307/237; 330/13, 15, 17

[56] References Cited

UNITED STATES PATENTS

| | | | |
|---|---|---|---|
| 3,246,251 | 4/1966 | Sheppard | 330/15 |
| 3,543,173 | 11/1970 | Egerton, Jr. | 330/18 X |
| 3,435,257 | 3/1969 | Lawrie, Jr. | 307/201 |

FOREIGN PATENTS OR APPLICATIONS

| | | |
|---|---|---|
| 1,258,903 | 1/1968 | Germany |

*Primary Examiner*—John W. Huckert
*Assistant Examiner*—B. P. Davis
*Attorney*—Michael S. Striker

[57] ABSTRACT

The standing current in series connected complementary transistors of a push-pull power stage is stabilized against fluctuations in temperature, supply voltage and/or changes in component use, by placing a current resistive element in series with the transistors in the path of the standing current. Voltage variations are developed across the resistive element in response to changes in the standing current caused by one more of the fluctuations. An electrode of an auxiliary transistor is connected between one of the complementary transistors and the resistive element to detect the voltage variations and modify the quiescent bias conditions in one of the series connected complementary transistors to counteract the effect of the changes.

10 Claims, 2 Drawing Figures

Inventor:
DIETER ELSAESSER
By: [illegible]
Attorney

STABILIZING CIRCUIT FOR STANDING CURRENTS

BACKGROUND OF THE INVENTION

The present invention relates to stabilizing circuits, and more particularly to a circuit for stabilizing the standing current in a transistor stage against fluctuations in operating temperature, supply voltage and/or changes in component values.

Circuits which stabilize the standing or quiescent currents in electrical circuits are known. Similarly, arrangements are known which are intended to stabilize a push-pull stage with series connected complementary transistors against the fluctuations in standing current which may be caused by fluctuations in operating temperature, supply voltage, and changes in component values. Such known prior arrangements are described in German printed publications Nos. 1,258,903 and 1,245,430, and in Austrian Pat. No. 263,076.

These known stabilizing circuits are generally provided with an auxiliary transistor whose emitter-collector path is arranged between the base electrodes of the output transistors of a push-pull power stage. The base of the auxiliary transistor is connected to a tap of a collector or emitter resistance of a preceding driver stage. Ohmic resistors as well as diodes have been utilized in the prior art in the driver stage for this purpose. In these known circuits, control for the auxiliary transistor is taken from the driver transistor so that the quiescent point of the auxiliary transistor is determined by the condition prevalent in the driver stage. The changes in the quiescent point of the auxiliary transistor affect the resistance of the emitter-collector path of the auxiliary transistor and in this manner the base bias of the output stage is controlled.

The stabilizing circuits for push-pull stages as just described, exhibit the disadvantage that the auxiliary transistor, which is responsible for establishing the quiescent points for the bases of the output-stage transistors, is affected by the driver current, i.e., by the operational state of a component which may not necessarily react in the same way to fluctuations in operating temperature or operating voltage as the output stage itself. Also, the conventional stabilizing circuits are sensitive to spreads in component value in the driver stage and must in some circumstances be balanced out by suitable adjustments.

SUMMARY OF THE INVENTION

An object of the present invention is to overcome the disadvantages of the known stabilizing circuits.

Another object of the invention is to provide a simple, inexpensive and effective means for stabilizing the quiescent current in a transistor stage.

Still another object of the invention is to provide effective means for stabilizing the quiescent current in the transistor stage against variations caused by temperature, supply voltage and changes in component values in the transistor stage.

A further object of the invention is to provide effective means for stabilizing the quiescent current in a transistor stage which does not require extensive initial adjustments and which does not require adjustments during operation of the circuit.

A still further object of the invention is to provide a stabilizing circuit which will react only to changes in the quiescent current which it stabilizes.

According to the present invention, a circuit for stabilizing the standing current of a push-pull stage includes sensing means for monitoring the changes in the standing current, such as a resistive component which is inserted into the path of the current. Means, responsive to the sensing means, modifies the standing current and compensates for the level of the current to counteract the changes.

According to a presently preferred embodiment, the present invention avoids the disadvantages of the type described in connection with known stabilizing circuits by inserting an ohmic resistance in series with a pair of complementary transistors which constitute a push-pull power stage. The resistive element is placed in the path of flow of the standing current which likewise flows through the series transistors. An auxiliary transistor may be provided and the emitter-collector path of such auxiliary transistor is arranged between the base electrodes of the series connected push-pull transistors. The base of the auxiliary transistor is connected to a point connecting the resistive series element and an electrode of one of the series connected push-pull transistors. The base of one of the series connected push-pull transistors is connected to one of the electrodes of the auxiliary transistor for monitoring the current in the collector-emitter path thereof. In this arrangement, a closed regulating circuit is produced which maintains the standing current passing through the resistive element at a substantially fixed value.

The novel features which are considered as characteristic for the invention are set forth in particular in the appended claims. The invention itself, however, both with additional objects and advantages thereof, will be best understood from the following description of specific embodiments when read in connection with the accompanying drawing.

DESCRIPTION OF THE PREFERRED EMBODIMENTS

Figure 1:
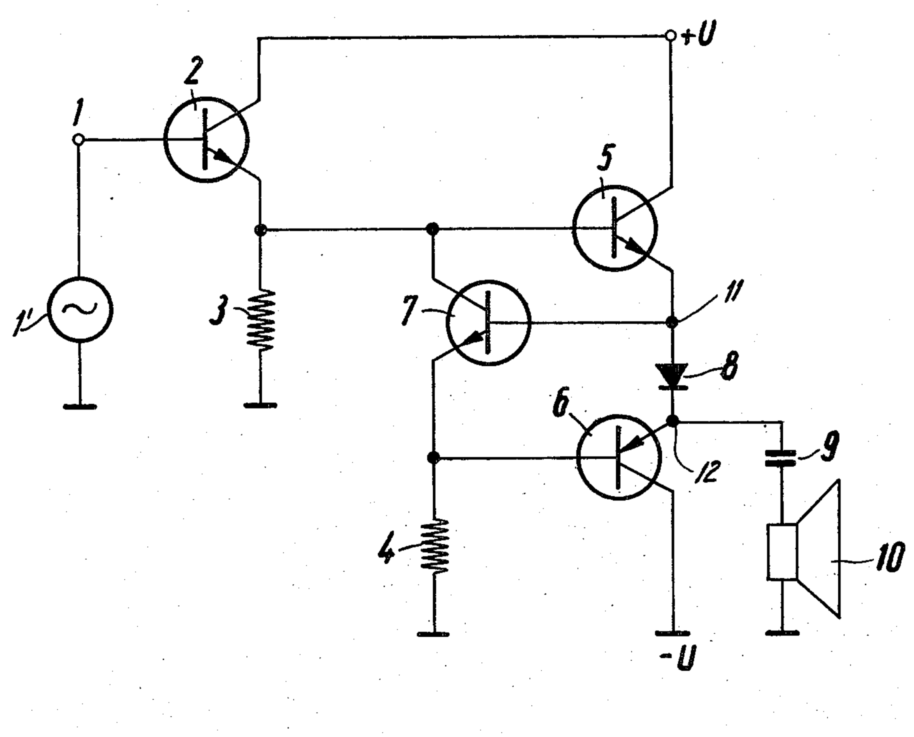
FIG. 1 is a diagram of series connected complementary transistors forming a push-pull power stage, shown with the addition of a series diode and an auxiliary transistor connected thereto in accordance with one embodiment of the present invention.

Referring now to the drawings, FIG. 1 shows the circuit of the present invention in conjunction with a push-pull power stage. A source 1', generating an input signal to be amplified in the stage, is connected to an input 1 for feeding the signal to the base of a driver transistor 2, shown to be connected in the emitter follower configuration. The collector of the driver transistor 2 is connected to the positive pole +U of a source of electrical energy, such as a power supply or a battery. The emitter of the driver transistor 2 is connected to a circuit reference potential point, such as the circuit ground, through a resistor 3.

A pair of complementary transistors 5 and 6 are connected in series, such that the collector-emitter current in each is substantially identical. Transistor 5 is shown to be a NPN transistor whose collector is connected to the positive pole +U, and whose base is connected to a junction point between the resistor 3 and the emitter of the driver transistor 2. The complementary transistor 6 is shown in FIG. 1 to be a PNP transistor whose collector is connected to the negative pole −U of the electrical energy source and whose emitter is connected to the emitter of the transistor 5 through a sensing means or an ohmic element 8, here shown to be a diode having cathode and anode electrodes. A resistor 4 is connected between the base of the transistor 6 and the reference potential point. An auxiliary or regulating transistor 7 has its emitter-collector path connected between the base electrodes of complementary transistors 5 and 6. The base of the auxiliary transistor 7 is connected to a junction point 11 between the emitter of the transistor 5 and the diode 8. The output of the push-pull stage is taken at the emitter of the transistor 6, shown at junction 12, through a capacitor 9 which couples the output power to a load such as a loudspeaker 10.

The signal source 1′, connected to input 1, feeds the driver transistor 2 and the signal appears across the resistor 3. The signal is fed from the emitter of the driver 2 directly to the base of the transistor 5, which is connected in series with the transistor 6 exhibiting the complementary type of conductivity. The two transistors 5 and 6 constitute a push-pull power stage, the emitter-collector paths being connected in series across the supply voltage having positive pole +U and negative pole −U. The output signal is taken from the junction point 12 of the element 8 and capacitively coupled to he loudspeaker 10.

In order to maintain the operation of the push-pull stage as just described, in a uniform and consistent manner, it is essential that the standing current flowing in the emitter-collector paths of the series connected complementary transistors 5 and 6 be maintained at a substantially constant value. It is known that the operating characteristics of transistors are not entirely linear. This also holds true for the quiescent voltage and current relationships, i. e., for direct voltages and currents. Changes in values of the quiescent point or standing point in a transistor may take the operation of the transistor into a less linear region, thereby affecting the high-frequency signals which are therein amplified.

Figure 2:
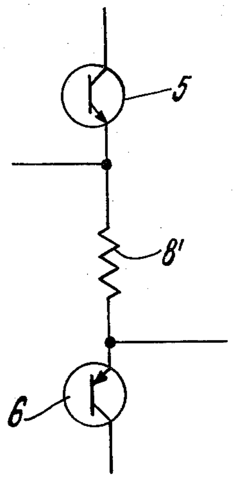
FIG. 2 illustrates a portion of the circuit shown in FIG. 1 wherein the diode is replaced by a resistor.

In order to stabilize the standing current flowing in the emitter-collector paths of series connected transistors 5 and 6 only two additional components are added according to the present invention. The first component is the resistive element 8 which is capable of conducting current in at least one direction which corresponds with the direction of flow of the standing current. Although shown in FIG. 1 in the form of a diode 8, any resistive element having this property can be used in place thereof. In FIG. 2 a resistor 8′ is shown to be used for this purpose. Reverting back to FIG. 1, the standing current to be stabilized generally flows from the positive pole +U through the collector and emitter of transistor 5, then through the diode 8, and finally through the emitter and collector of the transistor 6 and to the negative pole −U of the energy source. The diode 8, having a resistive component, develops a voltage by the passage of the standing current therethrough between the junction 11 and 12. For steady values of standing current passing through the diode 8, the voltage between the junctions 11 and 12 remains constant. However, when the standing current changes, the voltage which is developed between the junctions 11 and 12 changes accordingly.

According to a presently preferred embodiment, the complementary transistors 5 and 6 are of the germanium type, while the diode 8 and auxiliary transistor 7 are of the silicon type. Accordingly, the emitter-base junctions of complementary transistors 5 and 6, being biassed in a forward conducting direction, develop a substantially smaller voltage than does the diode 8, which is likewise in a forward conducting state. For this reason, since the voltage of the emitter-base junction of the complementary transistor 6 is small compared to the voltage developed across the diode 8, almost the entire voltage appearing between the base and the emitter of the auxiliary transistor 7 will be that which is developed across the diode 8.

The resistances of resistors 3 and 4 are selected to establish a desired standing current in the transistors 5 and 6 which will provide optimum linearity and efficiency. It is not critical that a particular bias point be fixed for the auxiliary transistor 7. All that counts is that the auxiliary transistor 7 should not be biassed in such a way that it is beyond cutoff or in saturation. The latter two conditions may not enable it to be effective for small variations in standing current. Assuming that the auxiliary transistor 7 is not in one of the aforementioned states, it behaves as a regulating element in a closed feedback loop which consists of the auxiliary transistor 7, resistor 4, complementary transistor 6, and diode 8.

By way of example, it will be assumed that a hitherto fixed standing current now has a tendency to rise a fixed amount either due to a variation in supply voltage, a rise in temperature of complementary transistors 5 and/or 6, or a change in one of the circuit elements, such as the complementary transistor 5. As soon as the standing current increases, the standing current passing through the diode 8 increases the voltage which is developed between the junctions 11 and 12 and, because the emitter-base potential of the complementary transistor 6 is small in comparison, substantially the entire voltage appearing between the junctions 11 and 12 will appear at the base-emitter junction of the auxiliary transistor 7. The auxiliary transistor 7 being a forward biassed NPN transistor, it will thereby be forced into further conduction. The increased conduction of the auxiliary transistor 7 will cause its collector-emitter current to increase, a substantial amount of the latter current flowing through the resistor 4 to the circuit reference potential point. The input resistance of the base of the transistor 6 generally being substantially higher than the value of resistor 4, most of the current flowing from the emitter of the transistor 7 flows into the resistor 4 and develops a voltage at the base of the transistor 6 in relation to the reference potential point of the circuit. Thus, an increase in the collector-emitter current in the auxiliary transistor 7 increases the voltage across the resistor 4, and thereby increases the voltage at the base of the complementary transistor 6 in relation to its emitter. Being a PNP transistor, the transistor 6 has its quiescent point thereby modified in a direction to decrease the standing current flowing through its emitter-collector path. This tendency to reduce the emitter-collector current through the transistor 6 is what neutralizes the tendency of the standing current to increase and thereby the standing current is stabilized. Also, the series connection of the emitter-collector path of auxiliary transistor 7 and resistor 4 forms a parallel connection to resistor 3. When, in the example just described, the current in the transistor 7 is forced to increase, the effective resistance of the transistor 7 decreases. Accordingly, the series combination of transistor 7 and resistor 4 correspondingly decreases. The effect of decreasing the resistance level at the base of the complementary transistor 5 also has the effect of lowering the voltage at the base of the transistor 5 in relation to its emitter. The transistor 5 being a NPN transistor, it is likewise forced to decrease its quiescent or standing current. Thus, an increase in the standing current flowing through the diode 8 has the effect of decreasing the conduction in both transistors 5 and 6 to counteract the increase.

It is now clear that the stabilizing means as described is not affected by the factor or factors which change the value of the standing current. Direct monitoring of the standing current by passing it through a resistive element, such as diode 8, provides the necessary information and enables activating means to counteract the changes. A similar example could be described for the opposite change in the standing current, such as when the standing current decreases from its fixed or desired value. The circuit then operates essentially in the same way, except in opposite directions, and such description is therefore not deemed necessary.

The transistors 5 and 6 of the above embodiment have been described as being of the germanium variety, and diode 8 and transistor 7 of the silicon variety. However, the use of such materials for these semiconductor components is not essential for the purposes of the present invention. Thus, the complementary transistors 5 and 6 could equally be of the silicon variety. However, by selecting, for example, the transistor 6 to be of the silicon variety, the resistance associated with the emitter-base junction of the transistor 6 would most likely be higher and changes in voltage appearing between the junctions 11 and 12 and caused by changes in the standing current may appear only in part across the emitter-base junction of the auxiliary transistor 7. Thus, although the circuit would still work and be effective as above-described, the operation would be less efficient.

Although embodied in a complementary push-pull power stage, it now becomes clear that the circuit of the present invention can be utilized in any transistor stage. It is only necessary to provide a closed or feedback loop wherein at least one resistive element is placed in the path of flow of the standing current to be stabilized, an auxiliary transistor to be added to monitor the voltage variations across the resistive element, and means for modifying the bias voltage of the transistor whose standing current is being stabilized in such a way that changes in standing current in one direction cause the bias on the transistor to oppose the flow of its standing current in that direction.

The embodiment shown in FIG. 1 is merely for illustrative purposes, it not being necessary that the input to the push-pull stage be taken from the emitter of a driver stage. Thus, it is equally possible that a driver stage other than the emitter-follower be used.

The circuit shown in FIG. 1 is effective to maintain the standing current at a substantially fixed value for variations in supply voltage, operating temperature and changes in circuit component values. However, it is assumed that most of the temperature variations will take place in complementary transistors 5 and 6, these being the push-pull output transistors which generally dissipate a substantial amount of energy. Diode 8 and auxiliary transistor 7 will generally not be affected by substantial changes in operating temperatures as are the transistors 5 and 6. The diode 8 can be used if the standing current is of low value. Where the entire circuit undergoes temperature changes, as for example extreme changes in ambient temperatures, it would generally be advisable to locate and mount the diode 8 and transistor 7 in such a way that the temperature variations have a minimum effect thereon. Because the diode 8 and the transistor 7 will change their characteristics as a function of changes in temperature, it may be advantageous in such cases—if the value of the standing current is high—to use the circuit shown in FIG. 2 wherein the resistor 8' is substituted for the diode 8. In this way, the changes in standing current will again develop voltages between the junctions 11 and 12 which are not a function of the temperature characteristics of the diode 8 but only a function of the standing current. Thus, the use of a resistor 8' between the junctions 11 and 12 provides a more predictable and reliable operation of the stabilizing circuit where the resistive component is likely to undergo changes in temperature.

While the invention has been illustrated and described as embodied in a stabilizing circuit for standing currents in a push-pull amplifier, it is not intended to be limited to the details shown, since various modifications and structural changes may be made without departing in any way from the spirit of the present invention.

I claim:

1. A stabilized push-pull circuit comprising first and second complementary push-pull transistors arranged to conduct standing current in a predetermined current path, said transistors respectively having first and second control electrodes arranged to receive control signals for modifying said current; regulating means having a third control electrode and connected to each of said first and second electrodes; and monitoring means arranged in said current path and connected to said third control electrode for monitoring changes in said current and for controlling said regulating means, said regulating means being operative for restoring said current when changes in the latter are detected by applying to said first and second electrodes control signals dependent on the monitored changes in said current.

2. A circuit as defined in claim 1, wherein said regulating means comprises a regulating transistor, said first, second and third control electrodes respectively comprising the bases of said first, second and regulating transistors, the collector and emitter electrodes of said regulating transistor being respectively connected to said first and second bases, and wherein said monitoring means has first and second terminals respectively connected to the emitters of said first and second transistors to define two junction points, and said third base being connected to one of said junction points.

3. A circuit as defined in claim 2, wherein said monitoring means comprises a diode having its anode connected to the emitter of said first transistor and its cathode connected to the emitter of said second transistor, and wherein said third base is connected to the junction formed by the connection of said anode and the emitter of said first transistor.

4. A circuit as defined in claim 3, further comprising a load resistance; and capacitor means connected between said load resistance and the junction formed by the connection of said cathode and the emitter of said second transistor.

5. A circuit as defined in claim 3, wherein said first and second transistors are of the germanium type, and said regulating transistor and said diode are of the silicon type.

6. A circuit as defined in claim 3, wherein all said transistors and said diode are of the germanium type.

7. A circuit as defined in claim 1, wherein said monitoring means comprises a resistor.

8. A stabilized push-pull circuit comprising first and second push-pull transistors having respective first and second collector-emitter paths together forming part of a current path for standing current, said transistors having respective first and second control electrodes arranged to receive control signals for modifying said current; regulating means having a third control electrode and connected to each of said first and second electrodes; and monitoring means comprising a diode defining a further part of said current path and connected to carry said standing current from the collector-emitter path of said first transistor to the collector-emitter path of said first transistor to the collector-emitter path of said second transistor and operative for monitoring changes in said current and for controlling said regulating means, said regulating means being operative for restoring said current when changes in the latter are detected by applying to said first and second control electrodes control signals dependent on the monitored changes in said current.

9. A circuit as defined in claim 8, further comprising a source of electrical energy having positive and negative poles, and wherein said positive pole is connected to the collector of said first transistor and said negative pole is connected to the collector of said second transistor.

10. A circuit as defined in claim 9, further comprising resistor means connected between each of said first and second control electrodes and said negative pole.

* * * * *